US009638751B2

(12) United States Patent
Kim

(10) Patent No.: US 9,638,751 B2
(45) Date of Patent: May 2, 2017

(54) PARALLEL TEST DEVICE AND METHOD

(71) Applicant: SK hynix Inc., Icheon-si, Gyeonggi-do (KR)

(72) Inventor: Min Chang Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/207,107

(22) Filed: Jul. 11, 2016

(65) Prior Publication Data

US 2016/0322118 A1    Nov. 3, 2016

Related U.S. Application Data

(62) Division of application No. 14/074,820, filed on Nov. 8, 2013, now Pat. No. 9,423,456.

(30) Foreign Application Priority Data

Jul. 5, 2013 (KR) ........................ 10-2013-0079072

(51) Int. Cl.
| | |
|---|---|
| *G01R 31/317* | (2006.01) |
| *G01R 31/319* | (2006.01) |
| *G11C 29/16* | (2006.01) |
| *G11C 29/40* | (2006.01) |
| *G11C 29/36* | (2006.01) |
| *G11C 29/44* | (2006.01) |
| *G11C 29/26* | (2006.01) |

(52) U.S. Cl.
CPC . *G01R 31/31716* (2013.01); *G01R 31/31921* (2013.01); *G11C 29/16* (2013.01); *G11C 29/36* (2013.01); *G11C 29/40* (2013.01); *G11C 29/44* (2013.01); *G11C 2029/2602* (2013.01)

(58) Field of Classification Search
CPC ........ G01R 31/31716; G01R 31/31921; G11C 2029/1201; G11C 2029/2602
See application file for complete search history.

(56) References Cited

U.S. PATENT DOCUMENTS

| | | | | |
|---|---|---|---|---|
| 5,362,996 A | * | 11/1994 | Yizraeli | ........... H03K 19/00346 326/27 |
| 6,118,688 A | * | 9/2000 | Hirano | .................... G11C 11/22 365/145 |
| 6,385,748 B1 | * | 5/2002 | Chen | ................ G01R 31/31701 365/201 |

(Continued)

*Primary Examiner* — Steve Nguyen
(74) *Attorney, Agent, or Firm* — William Park & Associates Ltd.

(57) ABSTRACT

A parallel test device and method are disclosed, which relates to a technology for performing a multi-bit parallel test by compressing data. The parallel test device includes: a pad unit through which data input/output (I/O) operations are achieved; a plurality of input buffers configured to activate write data received from the pad unit in response to a buffer enable signal, and output the write data to a global input/output (GIO) line; a plurality of output drivers configured to activate read data received from the global I/O (GIO) line in response to a strobe delay signal, and output the read data to the pad unit; and a test controller configured to activate the buffer enable signal and the strobe delay signal during a test mode in a manner that the read data received from the plurality of output drivers is applied to the plurality of input buffers such that the read data is operated as the write data.

7 Claims, 8 Drawing Sheets

(56) References Cited

U.S. PATENT DOCUMENTS

| | | | | |
|---|---|---|---|---|
| 7,187,195 | B2* | 3/2007 | Kim | G01R 31/31921 |
| | | | | 326/16 |
| 7,836,372 | B2* | 11/2010 | Bodrozic | G01R 31/31716 |
| | | | | 714/718 |
| 8,369,167 | B2* | 2/2013 | Sawada | G11C 29/12 |
| | | | | 365/189.07 |
| 8,972,790 | B2* | 3/2015 | Nakabayashi | G06F 13/1673 |
| | | | | 365/189.05 |
| 2004/0128601 | A1* | 7/2004 | Muljono | G01R 31/31716 |
| | | | | 714/734 |
| 2005/0270859 | A1* | 12/2005 | Kato | G11C 29/025 |
| | | | | 365/189.05 |
| 2006/0059394 | A1* | 3/2006 | Spirkl | G11C 29/022 |
| | | | | 714/718 |
| 2006/0282722 | A1* | 12/2006 | Co | G11C 29/56 |
| | | | | 714/724 |
| 2006/0285423 | A1* | 12/2006 | Scheuerlein | G11C 11/404 |
| | | | | 365/230.06 |
| 2008/0205170 | A1* | 8/2008 | Ikeda | G11C 29/02 |
| | | | | 365/193 |
| 2009/0089633 | A1* | 4/2009 | Hirota | G11C 17/146 |
| | | | | 714/721 |
| 2009/0296504 | A1* | 12/2009 | Ishikawa | G11C 29/12 |
| | | | | 365/201 |
| 2010/0251042 | A1* | 9/2010 | Selking | G11C 29/02 |
| | | | | 714/719 |
| 2013/0265831 | A1* | 10/2013 | Miyaji | G01R 31/2894 |
| | | | | 365/189.04 |
| 2013/0271167 | A1* | 10/2013 | Thiruvengadam | G01R 31/2607 |
| | | | | 324/750.02 |

* cited by examiner

PARALLEL TEST DEVICE AND METHOD

CROSS-REFERENCE TO RELATED APPLICATION

This present application is a Division of U.S. application Ser. No. 14/074,820, filed on Nov. 8, 2013, and the present application claims priority based upon Korean patent application No. 10-2013-0079072, filed on Jul. 5, 2013, the disclosure of which is hereby incorporated in its entirety by reference herein.

BACKGROUND OF THE INVENTION

Embodiments of the present invention relate to a parallel test device and method, and more particularly to a technology for performing a multi-bit parallel test by compressing data.

In recent times, a semiconductor memory device includes a read global bus and a write global bus, instead of one global bus, such that it improves a slope of global input/output (I/O) signals. The write global bus transmits data received from data pads to a cell array during data recording. In addition, the read global bus transmits data received from a cell array to a data pad during data reading.

As semiconductor memory devices are highly integrated in proportion to rapid development of fabrication technologies, the semiconductor memory devices have been manufactured and then tested using a high-priced test device for a long period of time so as to guarantee reliability of chips contained in the semiconductor memory devices. In order to test the semiconductor memory devices, a self-test circuit is embedded into chips in a process of manufacture so as to reduce time and costs consumed in the self-testing process.

In order to reduce costs requisite for a test device configured to test and verify characteristics and functions of semiconductor chips, as many semiconductor chips as possible must be tested by only one testing. In order to test a large number of semiconductor chips through a channel allocated to each device, there is a need to test all the memory chips using as less chips as possible.

A conventional parallel test device serving as a self-testing device determines the presence or absence of a passed/failed state on the basis of a bank associated with the principal defective cells of semiconductor chips. However, the conventional parallel test device has been configured to copy I/O line data used for I/O lines contained in a specific part unused when all the cells are tested using a small number of I/O lines.

That is, the same data is written into a plurality of I/O lines using a single I/O line during the I/O data compression mode. However, it is impossible for the conventional parallel test device to recognize the presence or absence of one or more defective parts generated until I/O line data used for I/O lines unused in the write operation is copied. In addition, the conventional parallel test device is configured to use test global I/O lines during the read operation, such that it is impossible for the conventional parallel test device to recognize the presence or absence of a defective part in a normal global I/O line.

That is, it is impossible for the conventional parallel test device to screen the presence or absence of a defective part of a normal path unused in the multi-bit parallel test mode. In addition, the conventional parallel test device is unable to recognize the presence or absence of a defective part in a peripheral circuit during a normal mode instead of a test mode.

As described above, assuming that a defective part generated in the peripheral circuit is not recognized and a subsequent process is continuously performed, the loss of costs caused by this unnecessary subsequent process unavoidably increases. Specifically, when a multi-chip combined with other chips is implemented, a failure of the entire multi-chip occurs, such that the scope of damage of the multi-chip is unavoidably extended.

In other words, since one defective chip occurs in a package step after completion of the multi-bit parallel test on a wafer, Multi Chip Package (MCP), Double Die Package (DDP), and Quad Die Package (QDP), each of which is composed of a plurality of stacked chips, are failed because of the defective chip, resulting in increase in the loss of time and costs.

SUMMARY

Various embodiments of the present invention are directed to providing a parallel test driving device substantially obviates one or more problems due to limitations and disadvantages of the related art.

An embodiment of the present invention relates to a parallel test device and method for allowing a normal test operation to be performed in the multi-bit parallel test.

In accordance with an embodiment of the present invention, a parallel test device includes: a pad unit through which data input/output (I/O) operations are achieved; a plurality of input buffers configured to activate write data received from the pad unit in response to a buffer enable signal and output the write data to a global input/output (GIO) line; a plurality of output drivers configured to activate read data received from global I/O (GIO) line in response to a strobe delay signal and output the read data to the pad unit; and a test controller configured to activate the buffer enable signal and the strobe delay signal during a test mode in a manner that the read data received from the plurality of output drivers is applied to the plurality of input buffers such that the read data is operated as the write data.

In accordance with an embodiment of the present invention, a parallel test device includes: a pad unit through which data input/output (I/O) operations are achieved; a plurality of input buffers configured to activate write data and output the write data to a global input/output (GIO) line; and a plurality of output drivers configured to activate read data and output the read data to the pad unit, wherein data corresponding to charges of data transferred from the plurality of output drivers to a floated pin of the pad unit is applied to the plurality of input buffers during a test mode.

In accordance with an embodiment of the present invention, a parallel test method includes: writing data in a bank; activating an output buffer and an input buffer when a test mode signal is activated; performing a normal read operation on data of all global input/output (GIO) lines, and a normal write operation via a path through which data of the output driver is applied to the input buffer; compressing read data from the bank through a compression test unit, and outputting compressed data; and determining a presence or absence of failed data.

In accordance with an embodiment of the present invention, a parallel test method includes: writing data in a bank; performing a normal read operation on all global input/output (GIO) lines; performing a normal write operation via a path through which data corresponding to charges of data transferred from an output driver to a floated pin of a pad unit is applied to an input buffer; compressing read data received from the bank using a compression test unit, and outputting compressed data through the compression test unit; and determining a presence or absence of failed data.

In accordance with an embodiment of the present invention, a parallel test device includes: a plurality of input buffers configured to buffer data received from a pad unit in response to a buffer enable signal and the buffered data to a data I/O unit; a plurality of output drivers configured to activate the data received from the data I/O unit and output the activated data to the pad unit; and a test controller configured to control a write enable signal and a data strobe signal in response to a test mode signal, and output the buffer enable signal to at least one of the plurality of input buffers and output a strobe signal to at least one of the plurality of output drivers.

It is to be understood that both the foregoing general description and the following detailed description of the present invention are explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Reference will now be made in detail to embodiments of the present invention, examples of which are illustrated in the accompanying drawings. Wherever possible, the same reference numbers will be used throughout the drawings to refer to the same or like parts.

Figure 1:
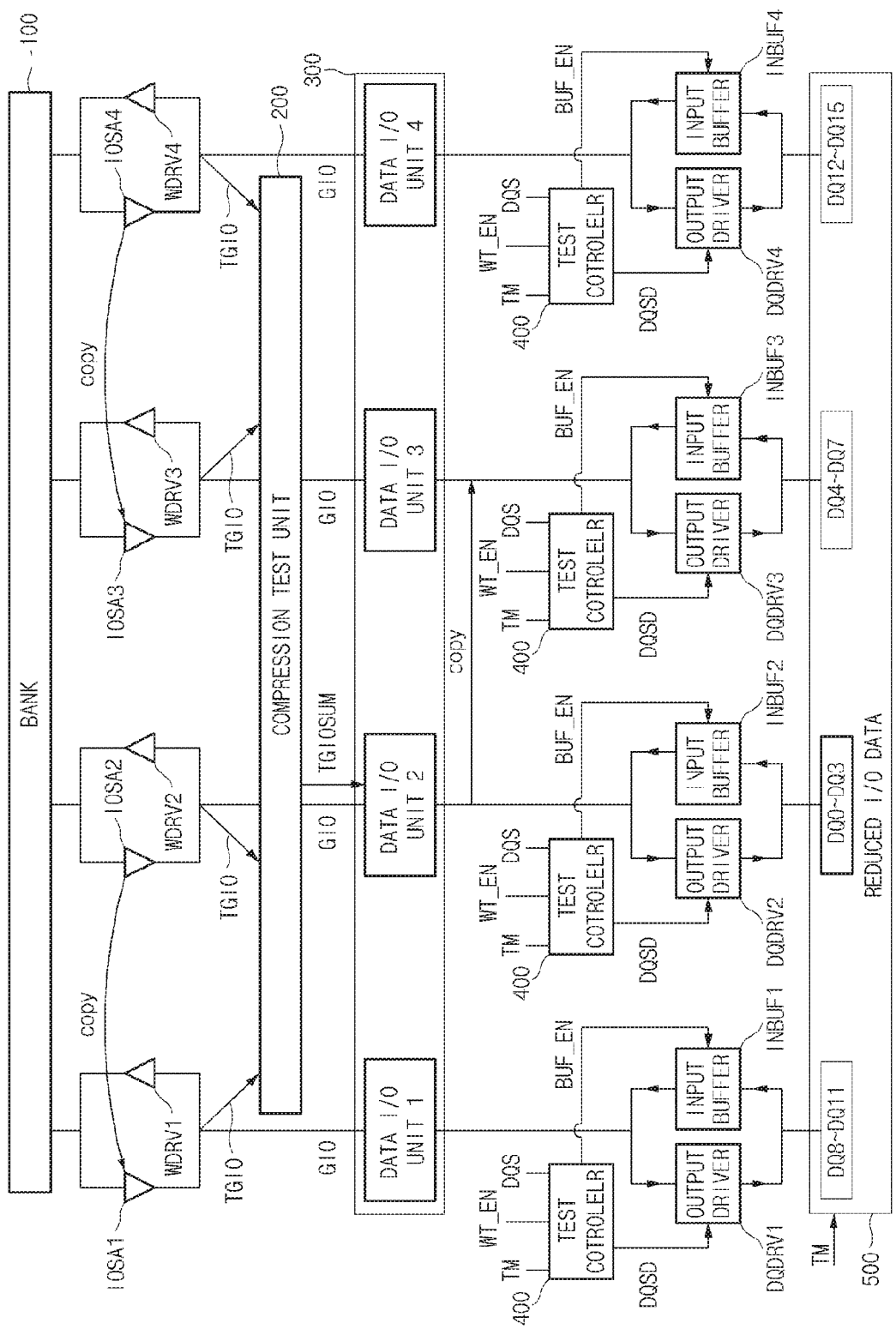
FIG. 1 is a block diagram illustrating a parallel test device according to an embodiment.

FIG. 1 is a block diagram illustrating a parallel test device according to an embodiment.

Referring to FIG. 1, the parallel test device may include a bank 100, a plurality of I/O sense-amplifiers (IOSA1~IOSA4), a plurality of write drivers (WDRV1~WDRV4), a compression test unit 200, a data I/O unit 300, a plurality of output drivers (DQDRV1~DQDRV4), a plurality of input buffers (INBUF1~INBUF4), a test controller 400, and a pad unit 500.

The parallel test device may be configured to use a self-test mode referred to as a DQ compress test so as to reduce a test time. The DQ compress test acting as a self-test method may store the same data in a plurality of memory cells, simultaneously output the stored data, compress the simultaneously output data, and compare the compressed results with each other, such that it can test the presence or absence of one or more errors in a memory device.

When a compression test is performed on the semiconductor memory device, the semiconductor memory device may receive external data through a data pad (DQ). In addition, the same data is copied in several I/O lines using a single I/O line, such that the semiconductor memory device may use the resultant I/O lines.

Since the semiconductor memory device outputs the compressed data when performing the data compression test (DQ compression test), the number of used data output channels (i.e., the number of used data pads) can be minimized. Therefore, it may be possible to simultaneously test a plurality of dies using the DQ compression test. For example, in order to test and verify characteristics and functions of the semiconductor memory device, various tests may be applied to semiconductor chips contained in the semiconductor memory device. In order to reduce costs consumed for a device for testing the semiconductor chips, it may be necessary for as many semiconductor chips as possible to be tested using only one test.

In order to test a large number of semiconductor chips, all the chips should be tested using as less I/O lines as possible. For this purpose, a multi-bit parallel test method has been known to those skilled in the art.

The multi-bit parallel test method simultaneously may write data in a plurality of cells, compare output values of the cells with each other, and determine the passed or failed state of individual cells, resulting in a reduction of a test time. In addition, in order to test as many chips as possible through a channel allocated to each test device, the multi-bit parallel test method may reduce the number of semiconductor memory I/O lines used for such testing.

The multi-bit parallel test device may determine the presence or absence of a passed or failed state on the basis of the bank 100 associated with the principal defective cell of a semiconductor chip. In the case of testing all the cells using a small number of global I/O (GIO) lines, unused GIO lines may be configured to copy data of the used GIO line.

In the parallel test device according to an embodiment, a plurality of I/O sense-amplifiers (IOSA1~IOSA4) and a plurality of write drivers (WDRV1~WDRV4) may be coupled to the bank 100. The I/O sense-amplifiers (IOSA1~IOSA4) may sense or amplify read data received from the bank 100, and output the amplified read data to the global I/O (GIO) line. The write drivers (WDRV1~WDRV4) may activate write data received from the GIO line, and output the activated write data to the bank 100.

Although an embodiment has exemplarily disclosed four I/O sense-amplifiers (IOSA1~IOSA4) and four write drivers (WDRV1~WDRV4) for convenience of description and better understanding of the present invention, the number of I/O sense-amplifiers and the number of write drivers are not limited thereto, a different number of I/O sense-amplifiers and a different number of write drivers may also be used according to the size of the bank 100 or other constituent elements.

The compression test unit 200 may be coupled to a plurality of I/O sense-amplifiers (IOSA1~IOSA4), and coupled to two data I/O parts (Data I/O unit 1, Data I/O unit 2) contained in a data I/O unit 300. The compression test unit 200 may perform a compression test of I/O data during probe testing, and output compressed data (TGIOSUM) to the data I/O unit 300.

During the data compression test, the same data may be written in a plurality of write driving units (for example, four write driving units in FIG. 1) WDRV1~WDRV4 coupled to a global I/O (GIO) line using the compression test unit 200 coupled to two data I/O units 2 and 3.

For example, when data is input to a representative data pad (DQ0), data may be input to the data I/O unit 300 through a single GIO line. As a result, data of the data I/O unit 2 may be copied and stored in the data I/O unit 3.

Data of the data I/O unit 2 and data of the data I/O unit 3 may be transmitted to one write driver WDRV2 and the other write driver WDRV3 through two GIO lines, respectively. Data transmitted to the write drivers (WDRV2, WDRV3) may be copied in four write drivers (WDRV1~WDRV4) coupled to the bank 100, such that the four write drivers (WDRV1~WDRV4) may be configured to output the same data. Data transmitted to the four write drivers (WDRV1~WDRV4) may be stored in the bank 100 through four I/O lines respectively corresponding to the four write drivers (WDRV1~WDRV4).

Data stored in the bank 100 may be re-transmitted to the I/O sense-amplifiers (IOSA1~IOSA4), such that the data is sensed and amplified by the I/O sense-amplifiers (IOSA1~IOSA4). The compression test unit 200 may compress data received from the I/O sense-amplifiers (IOSA1~IOSA4), and transmit compressed data (TGIOSUM) to the data I/O unit 300. The compressed data (TGIOSUM) may be transmitted to the pad unit 500 through the data I/O unit 300 and the output driver DQDRV. Accordingly, data read from the pad unit 500 may be coded to determine the presence or absence of defective or faulty data.

The data I/O unit 300 may select data applied to the GIO line during the read operation. During the write operation, the data I/O unit 300 may align input data, latch the aligned data, and output the latched data to the GIO line. Representative data I/O units 2 and 3 from among a plurality of data I/O units 300 may be coupled to the compression test unit 200 through the GIO line. In addition, the compressed data (TGIOSUM) generated from the compression test unit 200 may be applied to a representative data I/O unit 2.

The GIO line coupled to the remaining non-representative data I/O units 1 and 4 (Data I/O unit 1 and Data I/O unit 4) may not be coupled to the compression test unit 200, and may be coupled to the write drivers (WDRV1, WDRV4) and the I/O sense-amplifiers (IOSA1, IOSA4).

A plurality of output drivers (DQDRV1~DQDRV4) and a plurality of input buffers (INBUF1~INBUF4) may be coupled between the data I/O unit 300 and the pad unit 500. In this case, the output drivers (DQDRV1~DQDRV4) may be configured to activate data received from the data I/O unit 300 in response to a strobe delay signal (DQSD), and output the activated data to the pad unit 500. The input buffers (INBUF1~INBUF4) may be configured to buffer data received from the pad unit 500 in response to a buffer enable signal (BUF_EN), and output the buffered data to the data I/O unit 300.

In the case of the read operation in the normal mode, the output driver (DQDRV) may output data to the pad unit 500, and the input buffer (INBUF) does not operate. On the contrary, in the case of the write operation in the normal mode, the input buffer (INBUF) may receive write data from the pad unit 500, and the output driver (DQDRV) may not operate.

In addition, the test controller 400 may control a write enable signal (WT_EN) and a data strobe signal (DQS) in response to a test mode signal TM, output a buffer enable signal (BUF_EN) to the input buffer (INBUF), and output a strobe delay signal (DQSD) to the output driver (DQDRV).

In this case, if the test mode signal (TM) is activated to a high level, the test controller 400 may activate the buffer enable signal (BUF_EN), and output the activated buffer enable signal (BUF_EN). If the test mode signal (TM) is activated to a high level, the test controller 400 may activate the strobe delay signal (DQSD), and output the activated strobe delay signal (DQSD).

Therefore, if the test mode signal (TM) is activated, the output driver (DQDRV) may be activated such that read data is output from the output driver DQDRV. As a result, the input buffer (INBUF) may be activated, such that input data is applied to the data I/O unit 300 through the input buffer (INBUF).

The pad unit 500 may be coupled to a plurality of output drivers (DQDRV1~DQDRV4) and a plurality of input buffers (INBUF1~INBUF4). The pad unit 500 may be divided into a plurality of pad groups (DQ8~DQ11, DQ0~DQ3, DQ4~DQ7, DQ12~DQ15). The compressed data may be transmitted and/or received through a single representative pad group (DQ0~DQ3) from among the plurality of pad groups (DQ8~DQ11, DQ0~DQ3, DQ4~DQ7, DQ12~DQ15).

For example, the semiconductor memory device such as a DRAM may be configured to use an I/O data compression mode during probe testing. Only one representative data pad from among a plurality of pads contained in the pad unit 500 may be used in the I/O data compression mode. Therefore, during the I/O data compression mode, time and costs requisite for the test can be reduced. For example, only one data pad (DQ0) contained in the data pad group DQ03 may be used as a representative pad.

Figure 2:
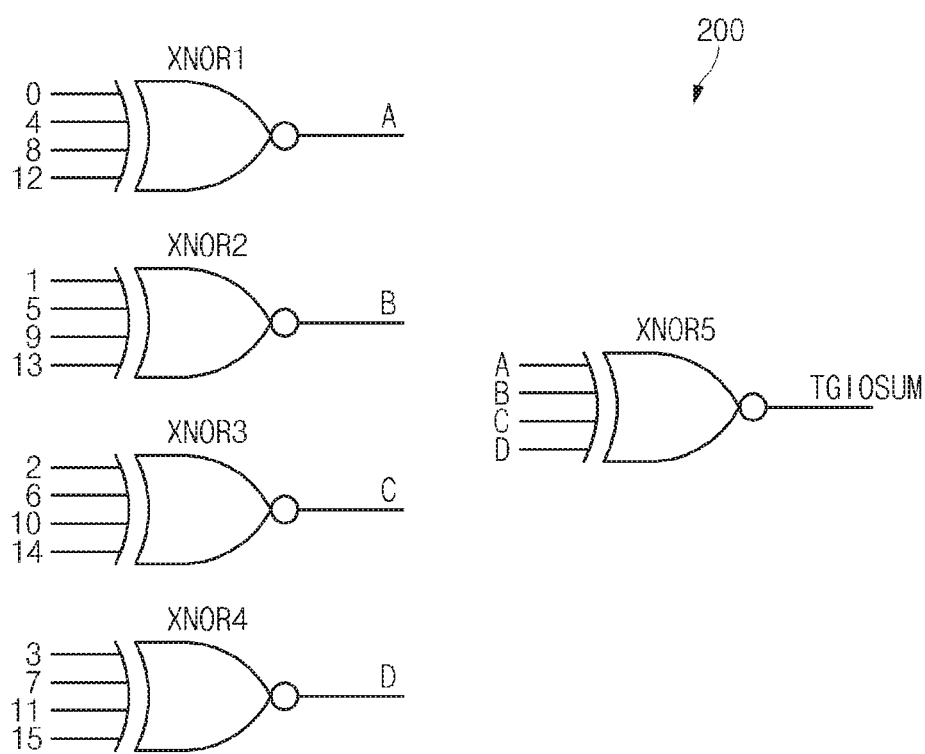
FIG. 2 is a detailed circuit diagram illustrating a compression test unit shown in FIG. 1.

FIG. 2 is a detailed circuit diagram illustrating the compression test unit 200 shown in FIG. 1.

Referring to FIG. 2, the compression test unit 200 may include a plurality of exclusive NOR gates (XOR1~XOR5). The compression test unit 200 may compress data received from the test GIO (TGIO) line, read the compressed data, and output one compressed data (TGIOSUM).

The exclusive NOR gate (XOR1) may perform an exclusive NOR operation among a plurality of data segments (0, 4, 8, 12) received from the I/O sense-amplifiers (IOSA1~IOSA4), such that it outputs a signal A. The exclusive NOR gate (XOR2) may perform an exclusive NOR operation among data segments (1, 5, 9, 13) received from the I/O sense-amplifiers (IOSA1~IOSA4), such that it outputs a signal B. The exclusive NOR gate (XOR3) may perform an exclusive NOR operation among data segments (2, 6, 10, 14) received from the I/O sense-amplifiers (IOSA1~IOSA4), such that it outputs a signal C. The exclusive NOR gate (XOR4) may perform an exclusive NOR operation among data segments (3, 7, 11, 15) received from the I/O sense-amplifiers (IOSA1~IOSA4), such that it outputs a signal D. The exclusive NOR gate (XOR5) may perform an exclusive NOR operation among the signals (A~D), such that it outputs one compressed data (TGIOSUM).

If the same input data is applied to the exclusive NOR gates (XOR1~XOR5), the exclusive NOR gates (XOR1~XOR5) may output a logic value of 1. Therefore, only when the same data is stored in memory cells of the bank 100, the compression test unit 200 may output the compressed data (TGIOSUM) as the logic value of 1. If at least one failed data occurs, the compression test unit 200 may output the compressed data (TGIOSUM) as a logic value of 0, and determine the data (TGIOSUM) indicating the logic value of 0 to be the failed data.

Figure 3:
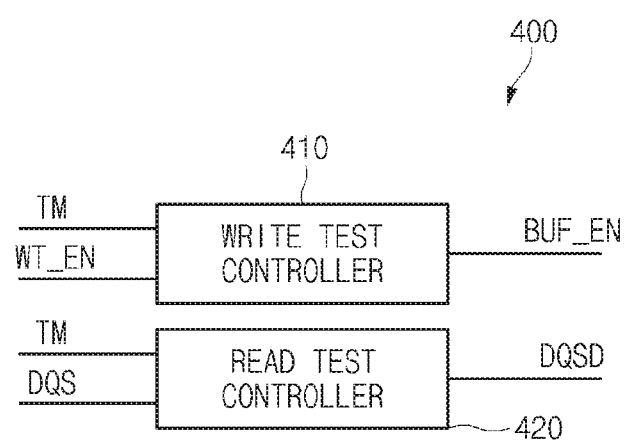
FIG. 3 is a detailed circuit diagram illustrating a test controller shown in FIG. 1.

FIG. 3 is a detailed circuit diagram illustrating the test controller 400 shown in FIG. 1.

Referring to FIG. 3, the test controller 400 may include a write test controller 410 and a read test controller 420.

During the write operation, the write test controller 410 may control the write enable signal (WT_EN) in response to the test mode signal (TM), and output the buffer enable signal (BUF_EN) to the input buffer (INBUF). During the read operation, the read test controller 420 may control the data strobe signal (DQS) in response to the test mode signal (TM), such that it outputs the strobe delay signal (DQSD) to the output driver (DQDRV).

Figure 4:
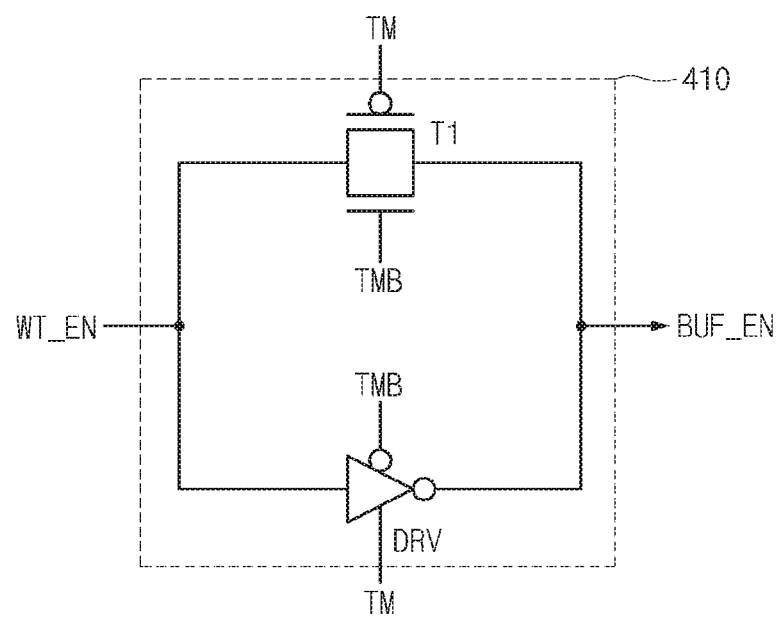
FIG. 4 is a detailed circuit diagram illustrating a write test controller shown in FIG. 3.

FIG. 4 is a detailed circuit diagram illustrating the write test controller 410 shown in FIG. 3.

Referring to FIG. 4, the write test controller 410 may include a transfer gate T1 and a driver DRV.

In this case, the transfer gate T1 may selectively control the output signal of the write enable signal (WT_EN) in response to test mode signals (TM, TMB), such that it outputs a buffer enable signal (BUF_EN). The test mode signal (TMB) may be an inverting signal of the test mode signal (TM). The driver DRV may invert the write enable signal (WT_EN) in response to the test mode signals (TM, TMB), such that it outputs the buffer enable signal (BUF_EN). The driver DRV may invert the write enable signal (WT_EN) in response to the test mode signals (TM, TMB), such that it outputs the buffer enable signal (BUF_EN).

That is, assuming that the test mode signal (TM) of the write test controller 410 is activated to a high level, the transfer gate T1 may be turned off and the driver DRV operates. Accordingly, assuming that the test mode signal (TM) is at a high level, the write enable signal (WT_EN) may be inverted such that the test controller 410 outputs the buffer enable signal (BUF_EN).

In contrast, assuming that the test mode signal (TM) of the write test controller 410 is deactivated to a low level, a transfer gate T1 may be turned on such that the driver DRV does not operate. Accordingly, assuming that the test mode signal (TM) is at a low level, the write enable signal (WT_EN) may be output as the buffer enable signal (BUF_EN) without change.

Figure 5:
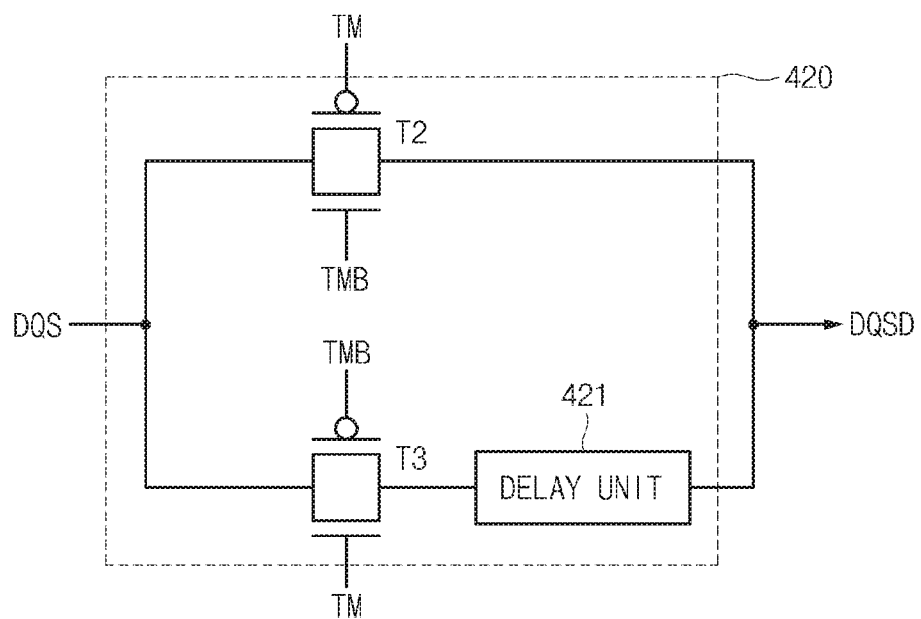
FIG. 5 is a detailed circuit diagram illustrating a read test controller shown in FIG. 3.

FIG. 5 is a detailed circuit diagram illustrating the read test controller 420 shown in FIG. 3.

Referring to FIG. 5, the read test controller 420 may include transfer gates (T2, T3) and a delay unit 421. In this case, the transfer gate T2 may selectively control the data strobe signal (DQS) in response to test mode signals (TM, TMB), such that it outputs a strobe delay signal (DQSD). The transfer gate T3 may selectively output the data strobe signal (DQS) in response to the test mode signals (TM, TMB). The delay unit 421 may delay the output signal of the transfer gate T3 by a predetermined time, such that it outputs the strobe delay signal (DQSD).

In other words, assuming that the test mode signal (TM) may be activated to a high level, the transfer gate T2 may be turned off and the transfer gate T3 is turned on. Accordingly, the data strobe signal (DQS) may be delayed by a delay time of the delay unit 421, such that the read test controller 420 may output the strobe delay signal (DQSD).

On the contrary, assuming that the test mode signal (TM) is deactivated to a low level, the transfer gate T2 may be turned on and the transfer gate T3 is turned off. Accordingly, the data strobe signal (DQS) may be output as the strobe delay signal (DQSD) without change.

Figure 6:
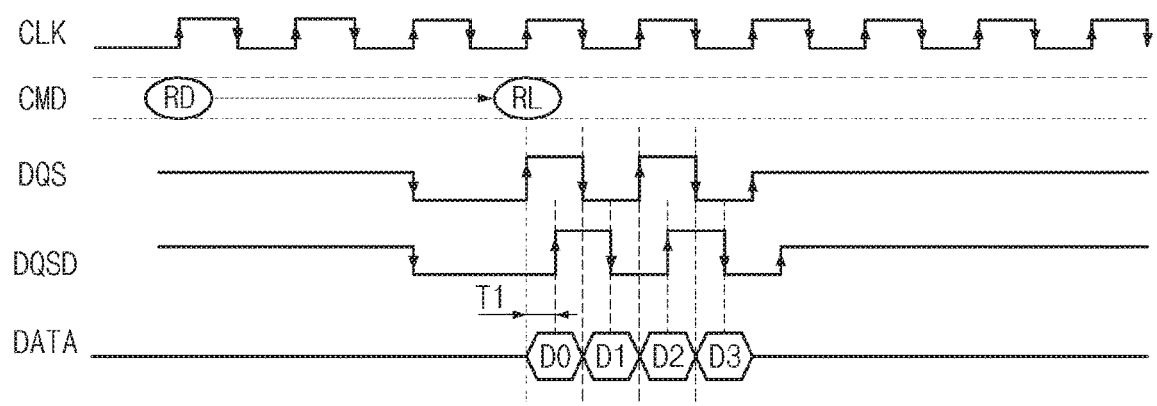
FIG. 6 is a timing diagram illustrating the operations of the parallel test device shown in FIG. 1.

FIG. 6 is a timing diagram illustrating the operations of the parallel test device shown in FIG. 1.

Referring to FIG. 6, the parallel test device may be synchronized with the rising edge of a clock signal (CLK), such that it receives a read command (RD). After lapse of a predetermined time, the data strobe signal (DQS) may be synchronized with the clock signal (CLK), and then toggled. If the test mode signal (TM) is enabled (or activated) to a high level, the transfer gate T3 of the read test controller 420 may be turned on. Therefore, when the test mode signal (TM) is activated, the center edge of the read data generated from the pad unit 500 may not be synchronized with the data strobe signal (DQS), and may be synchronized with the strobe delay signal (DQSD) delayed by a predetermined time T1, such that the synchronized result is output. FIG. 6 also illustrates a command (CMD) and a read latency (RL).

In other words, during the read operation in the normal mode, write data may not be input to the input buffer (INBUF) under the condition that the output driver (DQDRV) outputs data. However, assuming that the test mode signal (TM) is activated according to an embodiment, the buffer enable signal (BUF_EN) may be enabled (or activated) to a high level by the driver DRV although the write enable signal (WT_EN) is at a low level.

As a result, during the test mode, the input buffer (INBUF) may be activated (or enabled) although it stays in the read operation. That is, the output driver (DQDRV) and the input buffer (INBUF) may be simultaneously operated in the read operation of the test mode.

Therefore, the read data generated from the output driver (DQDRV) may be re-input to the input buffer (INBUF), and may then be transmitted to the bank 100 through the write path. In other words, the read data obtained through the output driver (DQDRV) may be immediately input to the input buffer (INBUF), such that the resultant input data may be used as write data for the write operation.

In this case, since the write enable signal (WT_EN) is at a low level, new write data may not be input through the pad unit 500. Assuming that the output drive (DQDRV) and the input buffer (INBUF) are simultaneously operated in the test mode, a predetermined setup hold time may be required for synchronizing the data I/O time point.

That is, during the read operation of the normal mode, the parallel test device may be synchronized with the edge time point of the data strobe signal (DQS), such that it outputs the resultant data. During the write operation of the normal mode, the parallel test device may be synchronized with the center time point of the data strobe signal (DQS), such that it results in the synchronized result.

In order to simultaneously data I/O operations by synchronizing the read time point of data with the write time point of data, the output time point of the output driver (DQDRV) should be controlled. For this purpose, according to an embodiment, the center edge of the read data read by the output driver (DQDRV) may not be synchronized with the data strobe signal (DQS), and may be synchronized with the strobe delay signal (DQSD) delayed by a predetermined time T1.

In this case, the read data may be delayed by the predetermined time T1, such that the read data (D0~D3) is synchronized with the center time point of the data strobe signal (DQS) and then input to the input buffer (INBUF). Accordingly, data read by the output driver (DQDRV) may be re-used as write data without change.

Figure 7:
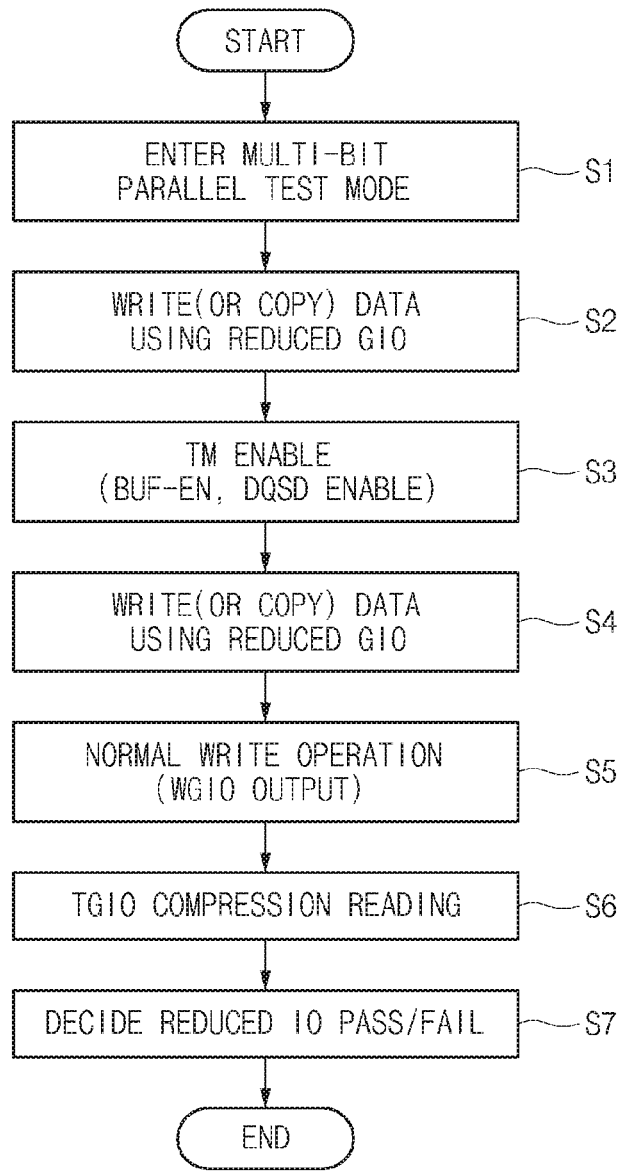
FIG. 7 is a flowchart illustrating a parallel test method according to an embodiment.

FIG. 7 is a flowchart illustrating a parallel test method according to an embodiment.

Referring to FIG. 7, if the parallel test device may enter the multi-bit parallel test mode in step S1, data is written in the bank 100 through a reduced GIO line according to the data copy scheme in step S2.

Thereafter, the test mode signal (TM) may be activated to a high level during the test mode in step S3. As a result, the buffer enable signal (BUF_EN) and the strobe delay signal (DQSD) may be enabled.

Subsequently, a normal read operation may be performed on all GIO lines coupled to the pad unit 500 in step S4. A write data alignment operation may be performed on data applied to the data I/O unit 300.

Thereafter, after completion of the normal write operation in step S5, write data aligned in the data I/O unit 300 may be applied to the GIO line. Data received from the test GIO (TGIO) line may be compressed and read, such that one compressed data (TGIOSUM) is output in step S6. Subsequently, data received from the pad unit 500 may be discriminated such that the passed or failed state of data can be determined in step S7.

In accordance with an embodiment, it may be possible to perform the data fail test on non-representative pads (for example, DQ4~DQ15) not coupled to the test device. Therefore, the parallel test device according to an embodiment can perform the normal test operation during the multi-bit testing, such that it can determine whether a defective part occurs in the data copy operation and can also test the presence or absence of a defective part in the peripheral circuit logic part.

That is, during the normal mode, the pad unit 500 is coupled to the corresponding GIO line such that the write or read operation is performed in the memory cell of the corresponding bank 100. In order to write data in all the cells during the normal mode, it is necessary to input data to all parts of the pad unit 500.

However, the multi-bit parallel test has to write data in all the cells using a small number of I/O lines, such that it can simultaneously test as many chips as possible using channels of a limited number of devices. For this purpose, before data is input to the cell, data of the used I/O line is copied in the unused I/O line.

First, the pad group used in the write operation of the multi-bit parallel test may be composed of 4 pads (DQ0~DQ3). In order to write data in all the cells, it is necessary to input data to all GIO lines. Therefore, before data is applied to the write driver (WDRV), data may be input to all GIO lines according to the data copy scheme.

For example, data of the pad (DQ0) may be copied in each of the pads (DQ4, DQ8, DQ12), and data of the pad (DQ1) may be copied in each of the pads (DQ5, DQ9, DQ13). Data of the pad (DQ2) may be copied in each of the pads (DQ6, DQ10, DQ14), and data of the pad (DQ3) may be copied in each of the pads (DQ7, DQ11, DQ15). Pad data of each group may be applied to the bank 100 through the GIO line and the write driver (WDRV), such that the same data is stored in memory cells.

In contrast, a separate test GIO (TGIO) line may be used in the read operation, such that no load occurs in loading of the GIO line having much load. In order to read data of all the cells, data of each TGIO line may be compressed and read through the compression test unit 200.

For example, assuming that a group of data segments (0, 4, 8, 12), a group of data segments (1, 5, 9, 13), a group of data segments (2, 6, 10, 14), and a group of data segments (3, 7, 11, 15) received from the test GIO (TGIO) line may be composed of the same data, the compression test unit 200 may output the compressed data (TGIOSUM) as the logic value of 1. If the compressed data (TGIOSUM) is output as the logic value of 1, this means that the test result may indicate a pass state.

In contrast, assuming that at least one from among a group of data segments (0, 4, 8, 12), a group of data segments (1, 5, 9, 13), a group of data segments (2, 6, 10, 14), and a group of data segments (3, 7, 11, 15) received from the test GIO (TGIO) line has different data, the compression test unit 200 may output the compressed data (TGIOSUM) as the logic value of 0. If the compressed data (TGIOSUM) is output as the logic value of 0, this means that the test result may indicate a fail state.

Figure 8:
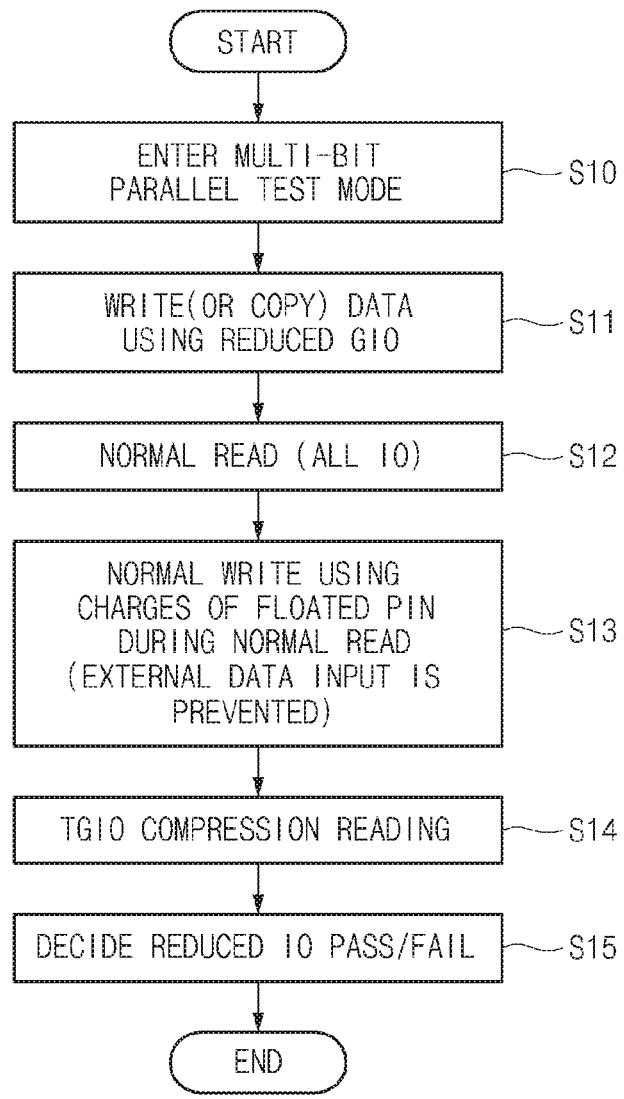
FIG. 8 is a flowchart illustrating a parallel test method according to an embodiment.

FIG. 8 is a flowchart illustrating a parallel test method according to an embodiment.

Referring to FIG. 8, if the parallel test device enters the multi-bit parallel test mode in step S10, data may be written in the bank 100 through a reduced GIO line according to the data copy scheme in step S11.

Subsequently, data of the bank 100 may be output to all the GIO lines upon completion of the normal read operation, such that the normal test operation may be achieved in step S12.

Thereafter, the normal write operation may be performed using charges of the floated pin during the normal read operation in step S13. Non-representative pads (for example, DQ4~DQ15) not coupled to the test device are maintained in the floated state. Accordingly, it is possible to perform the data fail test on the non-representative pads (for example, DQ4~DQ15) not coupled to the test device.

That is, data read from the bank 100 may be applied to the pad unit 500 during the normal read operation. As a result, during the read operation of data, capacitance of data may be maintained in pins of the pad unit 500 for a predetermined time. Assuming that no leakage current path is present in the corresponding pin of the pad unit 500, data read by the amount of self-charges may be preserved for a predetermined time (for example, several micrometers μs).

Therefore, the write operation may be performed in the middle of the multi-bit parallel test using data charges remaining in the floated pin of the pad unit 500. In this case, according to an embodiment of FIG. 8, the write operation may be performed using charges of the floated pin during the read operation, such that new external write data may not be input to the parallel test device.

The compression test unit 200 may compress and read data received from the test GIO (TGIO) line, such that it outputs one compressed data (TGIOSUM) in step S14. Subsequently, data received from the pad unit 500 may be discriminated so that the pass or fail state of data is decided in step S15. Therefore, the parallel test device can screen even a defective part of the normal path during the multi-bit parallel test operation.

As is apparent from the above description, the parallel test device and method according to various embodiments provide the following effects.

First, the parallel test device and method can allow a normal test operation to be performed in the multi-bit parallel test, such that it can check the presence or absence of a defective part in the peripheral circuit during a normal mode, and can also test the entire chip during the normal mode.

Second, the parallel test device and method can check the presence or absence of a defective part generated until I/O line data used for I/O lines unused for the write operation is copied.

Third, since the parallel test device and method uses test global I/O lines during the read operation, it may be possible to check the presence or absence of a defective part in a normal global I/O line.

Fourth, the parallel test device and method may reduce the number of I/O lines during a normal test mode, and simultaneously test a large number of chips using the reduced number of I/O lines, resulting in increase in test productivity.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A parallel test device comprising:
   a pad unit through which data input/output (I/O) operations are achieved;
   a plurality of input buffers configured to activate write data and output the write data to a global input/output (GIO) line; and
   a plurality of output drivers configured to activate read data and output the read data to the pad unit,
   wherein data corresponding to charges of data transferred from the plurality of output drivers to a floated pin of the pad unit is applied to the plurality of input buffers during a test mode.

2. The parallel test device according to claim 1, further comprising:
   a plurality of input/output (I/O) sense-amplifiers configured to sense/amplify data received from a bank, and output the amplified data to the GIO line and a test I/O line;
   a plurality of write drivers configured to activate data received from the GIO line, and output the activated data to the bank;
   a compression test unit configured to compress data received from the plurality of I/O sense-amplifiers during a data compression test, and output compressed data; and
   a data I/O unit configured to output either data received from the GIO line or the compressed data to the plurality of output drivers, and configured to output data received from the plurality of input buffers to the GIO line.

3. The parallel test device according to claim 1, wherein write data is not received from the pad unit during the test mode.

4. The parallel test device according to claim 1, wherein data is written in a bank using a representative data pad from among the pad units according to a data copy scheme.

5. A parallel test method, comprising:
   writing data in a bank;
   performing a normal read operation on all global input/output (GIO) lines;
   performing a normal write operation via a path through which data corresponding to charges of data transferred from an output driver to a floated pin of a pad unit is applied to an input buffer;
   compressing read data received from the bank using a compression test unit, and outputting compressed data through the compression test unit; and
   determining a presence or absence of failed data.

6. The parallel test method according to claim 5, further comprising:
   receiving no write data from the pad unit when the normal write operation is performed.

7. The parallel test method according to claim 5, further comprising:
   writing data in the bank using a representative data pad from among the pad units according to a data copy scheme.

* * * * *